(12) United States Patent
Chitradurga et al.

(10) Patent No.: US 12,731,771 B2
(45) Date of Patent: Sep. 8, 2026

(54) LOWER DEPOSITION CHAMBER CCP ELECTRODE CLEANING SOLUTION

(71) Applicant: Applied Materials, Inc., Santa Clara, CA (US)

(72) Inventors: Mukesh Shivakumaraiah Chitradurga, Chitradurga (IN); Luke Bonecutter, Cedar Park, TX (US); Sathya Swaroop Ganta, Sunnyvale, CA (US); Canfeng Lai, Fremont, CA (US); Jay D. Pinson, II, San Jose, CA (US); Kaushik Comandoor Alayavalli, Sunnyvale, CA (US); Kallol Bera, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 379 days.

(21) Appl. No.: 17/664,324

(22) Filed: May 20, 2022

(65) Prior Publication Data

US 2023/0377855 A1 Nov. 23, 2023

(51) Int. Cl.
*H01J 37/32* (2006.01)
*B08B 7/00* (2006.01)
*C23C 16/44* (2006.01)

(52) U.S. Cl.
CPC ...... *H01J 37/32862* (2013.01); *B08B 7/0035* (2013.01); *C23C 16/4405* (2013.01); *H01J 37/32091* (2013.01); *H01J 37/32715* (2013.01)

(58) Field of Classification Search
CPC ........... H01J 37/32862; H01J 37/32091; H01J 37/32715; H01J 2237/332–3348; B08B 7/0035; C23C 16/4405
USPC .................. 118/715–733; 156/345.1–345.55
See application file for complete search history.

(56) References Cited

U.S. PATENT DOCUMENTS 5,269,881 A * 12/1993 Sekiya .................. B08B 7/0035 134/1
6,071,372 A * 6/2000 Ye ..................... H01J 37/32477 156/345.48
6,478,924 B1 * 11/2002 Shamouilian ..... H01J 37/32706 118/728
8,187,416 B2 * 5/2012 Miller ............... H01J 37/32495 156/345.48
2001/0019016 A1 * 9/2001 Subramani .............. H01J 37/34 204/192.12

(Continued)

FOREIGN PATENT DOCUMENTS

JP S63253628 A * 10/1988
KR 102418621 B1 * 7/2022 ............... H05H 1/46

*Primary Examiner* — Charlee J. C. Bennett
(74) *Attorney, Agent, or Firm* — Patterson + Sheridan, LLP

(57) ABSTRACT

Embodiments of the present disclosure generally relate to a substrate processing chamber, and methods for cleaning the substrate processing chamber are provided herein. An electrode cleaning ring is disposed in a lower portion of a process volume (e.g., disposed below a substrate support in the process volume). The electrode cleaning ring is a capacitively coupled plasma source. The electrode cleaning ring propagates plasma into the lower portion of the process volume. RF power is provided to the electrode cleaning ring via an RF power feed-through. The RF plasma propagated by the electrode cleaning ring removes deposition residue in the lower portion of the process volume.

20 Claims, 5 Drawing Sheets

(56) References Cited

U.S. PATENT DOCUMENTS

2003/0051994 A1* 3/2003 Gopalraja ........... C23C 14/0057 204/192.12
2006/0105114 A1* 5/2006 White ................ C23C 16/0218 118/723 R
2006/0124634 A1* 6/2006 Mize ........................ H05B 6/36 219/672
2007/0080141 A1 4/2007 White et al.
2007/0258075 A1* 11/2007 Kim ................. H01L 21/68721 355/55
2008/0118663 A1 5/2008 Choi et al.
2012/0211358 A1 8/2012 Miller et al.
2013/0087286 A1* 4/2013 Carducci ........... H01J 37/32541 156/345.43
2020/0020565 A1* 1/2020 Rathnasinghe ... H01J 37/32807
2020/0370177 A1* 11/2020 Franklin ............. H01L 21/6831
2022/0102141 A1* 3/2022 Singh .................. H01L 21/0332
2022/0157577 A1* 5/2022 Cui ................... H01J 37/32706

* cited by examiner

LOWER DEPOSITION CHAMBER CCP ELECTRODE CLEANING SOLUTION

BACKGROUND

Field

Embodiments of the present disclosure relate to an apparatus and methods utilized in the manufacture of semiconductor devices. More specifically, embodiments of the present disclosure relate to a substrate processing chamber, and methods for cleaning the substrate processing chamber.

Description of the Related Art

Semiconductor processing involves a number of different chemical and physical processes where small integrated circuits are created on a substrate. Layers of materials which make up the integrated circuit are created by chemical vapor deposition, physical vapor deposition, epitaxial growth, chemical treatment, electrochemical process and the like.

During plasma processing, energized gas can etch and erode exposed portions of the process chamber components, for example, an electrostatic chuck that holds the substrate during processing. Additionally, processing by-products are often deposited on chamber components which should be periodically cleaned, typically with highly reactive fluorine. Accordingly, in order to maintain cleanliness of the process chamber, a periodic cleaning process is performed to remove the by-products from the process chamber. Attack from the reactive species during processing and cleaning reduces the lifespan of the chamber components and increases service frequency. Additionally, residual deposits can result in premature chamber component failure and frequent chamber maintenance. Moreover, it can be challenging to perform the periodic cleaning process on difficult to reach locations of the semiconductor process chamber, therefore leading to by-product accumulation in these locations.

Therefore, there is a need in the art for an improved a substrate processing chamber, and methods for cleaning the improved substrate processing chamber.

SUMMARY

In one embodiment, a process chamber is provided. The process chamber includes a lid assembly. The process chamber further includes a chamber body coupled to the lid assembly by a spacer with the spacer and the chamber body defining a process volume. The process chamber further includes a substrate support disposed and movable within the process volume and an electrode cleaning ring disposed around a perimeter of the process volume with the electrode cleaning ring positioned below at least an upper surface of the substrate support.

In another embodiment, a process chamber is provided. The process chamber includes a lid assembly and a chamber body coupled to the lid assembly by a spacer with the spacer and the chamber body defining a process volume. The process chamber includes a substrate support disposed and movable within the process volume and a electrode cleaning ring disposed around a perimeter of the process volume with the electrode cleaning ring positioned below at least an upper surface of the substrate support. The process chamber further includes a radiofrequency (RF) power feed-through disposed through the chamber body and a chamber liner coupled to the chamber body in the process volume, with the RF power feed-through coupled to the electrode cleaning ring. The process chamber further includes a cleaning RF power source conductively coupled to the electrode cleaning ring via the RF power feed-through.

In yet another embodiment, a method for cleaning a process chamber is provided. The method includes introducing a cleaning gas to a chamber volume of the process chamber, providing a first radiofrequency (RF) power having a first frequency of about 2 MHz or greater to a lid assembly of the process chamber, providing a second RF power having a second frequency of about 10 MHz to about 20 MHz to an electrode cleaning ring with the electrode cleaning ring disposed around a perimeter of the chamber volume with the electrode cleaning ring positioned below at least an upper surface of a substrate support in the chamber volume. The method further includes removing at least a portion of a deposition residue disposed in a lower portion of the chamber volume.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1 is a schematic side cross sectional view of an illustrative process chamber according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 2:
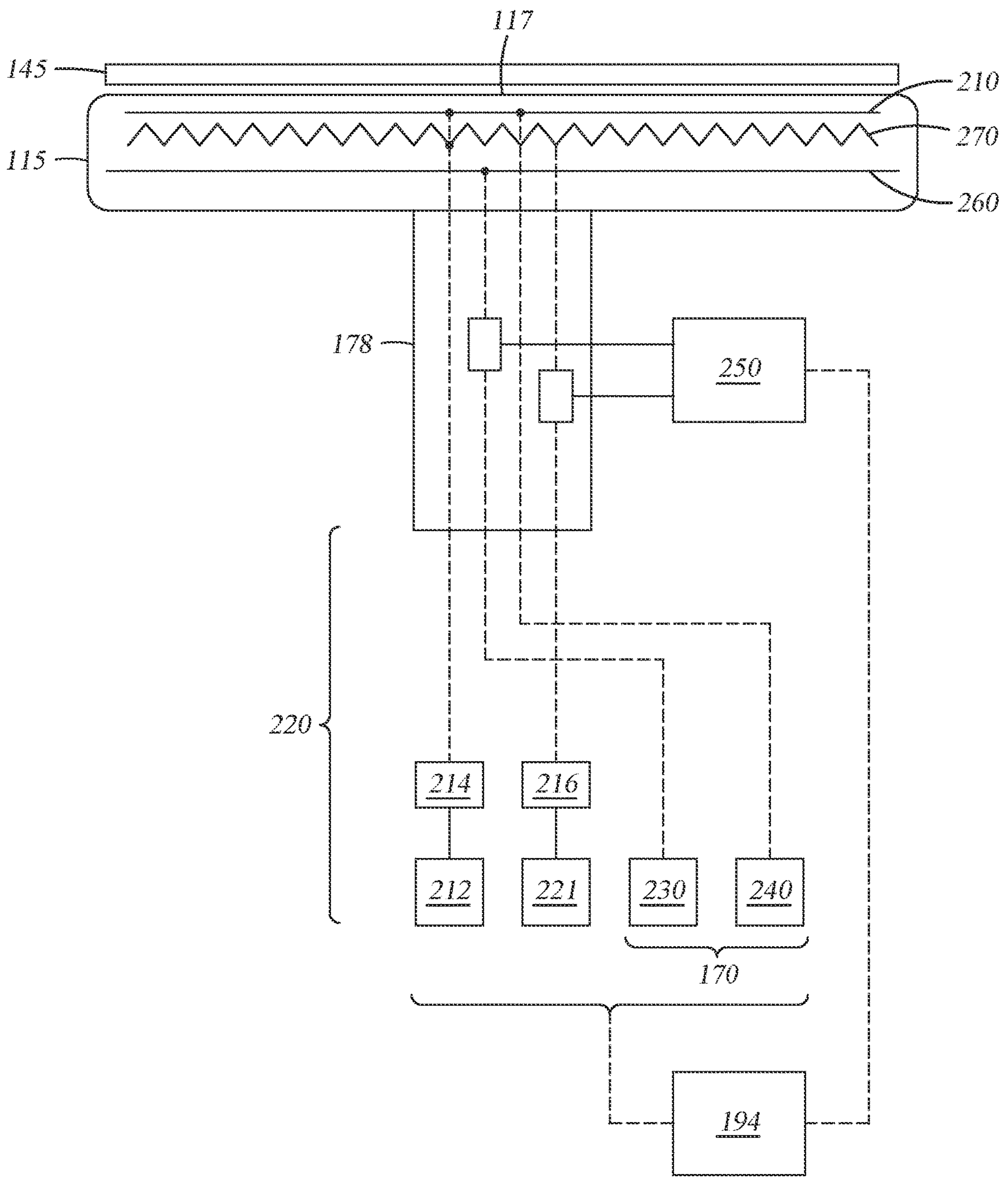
FIG. 2 depicts a schematic cross-sectional view of a substrate support according to an embodiment.

Embodiments of the present disclosure relate to an apparatus and methods utilized in the manufacture of semiconductor devices. More specifically, embodiments of the present disclosure relate to a substrate processing chamber, and methods for cleaning the substrate processing chamber. Substrate processing includes deposition processes, etch processes, as well as other low pressure, processes, plasma processes, thermal processes used to manufacture electronic devices on substrates. It is contemplated that other processing chambers and/or processing platforms, including those from other manufacturers, may be adapted to benefit from aspects of the disclosure.

FIG. 1 is a schematic side, cross sectional view of an illustrative process chamber 100 suitable for conducting a deposition process and a subsequent cleaning process. Although FIG. 1 depicts one chamber suitable for conducting the deposition process and the cleaning process described herein, other chambers are also contemplated. In one embodiment, which can be combined with other embodiments described herein, the process chamber 100 is configured to deposit advanced patterning films onto a substrate, such as hardmask films, for example amorphous carbon hardmask films. The process chamber 100 includes a lid assembly 105, a spacer 110 disposed on a chamber body 192, a substrate support 115, a variable pressure system 120, and a capacitively coupled plasma (CCP) cleaning system 122.

The lid assembly 105 includes a lid plate 125 and a heat exchanger 130. In the embodiment shown, which can be combined with other embodiments described herein, the lid assembly 105 also includes a showerhead 135, although other gas diffusers are also contemplated. The lid assembly 105 is coupled to a first processing gas source 140. The first processing gas source 140 contains precursor gases for forming films on a substrate 145 supported on the substrate support 115. As an example, the first processing gas source 140 includes precursor gases such as carbon containing gases, hydrogen containing gases, helium, among others. In a specific example, the carbon containing gas includes acetylene ($C_2H_2$). The first processing gas source 140 provides one or more precursor gases to a plenum 190 disposed in the lid assembly 105. The lid assembly 105 includes one or more channels for directing precursor gases from the first processing gas source 140 into the plenum 190. From the plenum 190, the precursor gases flow through the showerhead 135 into a process volume 160. The process volume 160 is defined by the chamber body 192.

In some embodiments, which can be combined with other embodiments described herein, a second processing gas source 142 is fluidly coupled to the process volume 160 via an inlet 144 disposed through a gas ring with nozzles attached to the spacer 110, or through a chamber side wall. As an example, the second processing gas source 142 includes precursor gases such as carbon containing gases, hydrogen containing gases, helium, among others, for example $C_2H_2$. In one embodiment, which can be combined with other embodiments described herein, a total flow rate of precursor gases into the process volume 160 is about 100 sccm to about 2 slm. The flow of the precursor gases in the process volume 160 via the second processing gas source 142 modulates the flow of the precursor gases flowing through the showerhead 135 such that the precursor gases are uniformly distributed in the process volume 160. In one example, a plurality of inlets 144 may be radially distributed about the spacer 110 or about the chamber sidewall. In such an example, gas flow to each of the inlets 144 may be separately controlled to further facilitate gas uniformity within the processing volume 160.

The lid assembly 105 is also coupled to an optional remote plasma source 150. The remote plasma source 150 is coupled to a cleaning gas source 155 for providing cleaning gases to the process volume 160 formed inside the spacer 110 between the lid assembly 105 and the substrate 145 during the cleaning process. In one example, cleaning gases are provided through a central conduit 191 formed axially through the lid assembly 105. In another example, cleaning gases are provided through the same channels which direct precursor gases. Example cleaning gases include oxygen-containing gases such as oxygen and/or ozone, as well fluorine containing gases such as $NF_3$, or combinations thereof.

In addition to or as an alternative to the remote plasma source 150, the lid assembly 105 is also coupled to a first or upper radio frequency (RF) power source 165. In one example, the remote plasma source 150 is omitted, and the cleaning gas is ionized into a plasma in situ via the first RF power source 165. The substrate support 115 is coupled to a second or lower RF power source 170. The first RF power source 165 is a RF power source with a frequency of about 2 MHz to about 13.56 MHz. The second RF power source 170 is a RF power source with a frequency of about 2 MHz to about 120 MHz.

It is to be noted that other frequencies are also contemplated. In some implementations, the second RF power source 170 is a mixed frequency RF power source, providing both high frequency and low frequency power. The second RF power source 165 facilitates a deposition process. Utilization of a dual frequency RF power source, particularly for the second RF power source 170, improves film deposition. In one example, utilizing a second RF power source 170 provides dual frequency powers. A first frequency of about 2 MHz to about 13.56 MHz improves implantation of species into the deposited film, while a second frequency of about 13.56 MHz to about 120 MHz increases ionization and deposition rate of the film. For example, during deposition, a first frequency of 13.56 MHz and a second frequency of 2 MHz are provided to the second RF power source 170 during processing. During a cleaning process, the second frequency is diverted to the first RF power source 165, while the first frequency is switched to the electrode cleaning ring 126.

One or both of the first RF power source 165 and the second RF power source 170 are utilized in creating or maintaining a plasma in the process volume 160. For example, the second RF power source 170 is utilized during a deposition process and the first RF power source 165 is utilized during a cleaning process (alone or in conjunction with the remote plasma source 150). In some deposition processes, the first RF power source 165 is used in conjunction with the second RF power source 170. During a deposition or etch process, one or both of the first RF power source 165 and the second RF power source 170 provide a power of about 100 Watts (W) to about 10 kW in the process volume 160 to facilitation ionization of a precursor gas. In one embodiment, which can be combined with other embodiments described herein, at least one of the first RF power source 165 and the second RF power source 170 are pulsed. In another embodiment, which can be combined with other embodiments described herein, the precursor gas includes helium and $C_2H_2$. In one embodiment, which can be combined with other embodiments described herein, $C_2H_2$ is provided at a flow rate of about 10 sccm to about 1,000 sccm and He is provided at a flow rate of about 50 sccm to about 10,000 sccm.

The substrate support 115 is coupled to an actuator 175 (i.e., a lift actuator) that provides movement thereof in the Z direction. The substrate support 115 is also coupled to a facilities cable 178 that is flexible which allows vertical movement of the substrate support 115 while maintaining communication with the second RF power source 170 as well as other power and fluid connections (see FIG. 2). The spacer 110 is disposed on the chamber body 192. A height of the spacer 110 allows movement of the substrate support 115 vertically within the process volume 160. The height of the spacer 110 is about 0.5 inches to about 20 inches. In one example, the substrate support 115 is movable from a first distance 180A to a second distance 180B relative to the lid assembly 105 (for example, relative to a lower surface of the showerhead 135). In one embodiment, the second distance 180B is about ⅔ of the first distance 180A. For example, the difference between the first distance 180A and the second distance is about 5 inches to about 6 inches. Thus, from the position shown in FIG. 1, the substrate support 115 is movable by about 5 inches to about 6 inches relative to a lower surface of the showerhead 135. In another example, the substrate support 115 is fixed at one of the first distance 180A and the second distance 180B. In contrast to conventional plasma enhanced chemical vapor deposition (PECVD) processes, the spacer 110 greatly increases the distance between (and thus the volume between) the substrate support 115 and the lid assembly 105. The increased distance between the substrate support 115 and the lid assembly 105 reduces collisions of ionized species in the process volume 160, resulting in deposition of film with less neutral stress, such as less than 2.5 gigapascal (GPa). Films deposited with less neutral stress facilitate improved planarity (e.g., less bowing) of substrates upon which the film is formed. Reduced bowing of substrates results in improved precision of downstream patterning operations.

The variable pressure system 120 includes a first pump 182 and a second pump 184. The first pump 182 is a roughing pump that is utilized during a cleaning process and/or substrate transfer process. A roughing pump is generally configured for moving higher volumetric flow rates and/or operating a relatively higher (though still sub-atmospheric) pressure. In one example, the first pump 182 maintains a pressure within the process chamber less than 50 mtorr during a cleaning process. In another example, the first pump 182 maintains a pressure within the process chamber of about 0.5 mTorr to about 10 Torr.

The second pump 184 is one of a turbo pump and a cryogenic pump. The second pump 184 is utilized during a deposition process. The second pump 184 is generally configured to operate at a relatively lower volumetric flow rate and/or pressure. For example, the second pump 184 is configured to maintain the process volume 160 of the process chamber at a pressure of less than about 50 mtorr. In another example, the second pump 184 maintains a pressure within the process chamber of about 0.5 mtorr to about 10 Torr. The reduced pressure of the process volume 160 maintained during deposition facilitates deposition of a film having reduced neutral stress and/or increased $sp^2$-$sp^3$ conversion, when depositing carbon-based hardmasks. Thus, process chamber 100 is configured to use both relatively lower pressure to improve deposition and relatively higher pressure to improve cleaning.

In some embodiments, which can be combined with other embodiments described herein, both of the first pump 182 and the second pump 184 are utilized during a deposition process to maintain the process volume 160 of the process chamber at a pressure of less than about 50 mtorr. In other embodiments, the first pump 182 and the second pump 184 maintain the process volume 160 at a pressure of about 0.5 mTorr to about 10 Torr. A valve 186 is utilized to control the conductance path to one or both of the first pump 182 and the second pump 184. The valve 186 also provides symmetrical pumping from the process volume 160.

The process chamber 100 also includes a substrate transfer port 185. The substrate transfer port 185 is selectively sealed by an interior door 186A and an exterior door 186B. Each of the doors 186A and 186B are coupled to actuators 188 (i.e., a door actuator). The doors 186A and 186B facilitate vacuum sealing of the process volume 160. The doors 186A and 186B also provide symmetrical RF application and/or plasma symmetry within the process volume 160. Seals 116, such as O-rings, disposed at the interface of the spacer 110 and the chamber body 192 further seals the process volume 160. A controller 194 coupled to the process chamber 100 is configured to control aspects of the process chamber 100 during processing.

During deposition processes, deposition residue may collect in a lower portion 112 of the process volume 160. For example, deposition residue may collect on the substrate support 115 and along the chamber body 192 in the lower portion 112. To remove the deposition residue from the lower portion 112, the CCP cleaning system 122 is utilized. The CCP cleaning system 122 includes a cleaning RF power source 123, a cleaning matching network 124, an RF power feed-through 121, and an electrode cleaning ring 126. The CCP cleaning system 122 improves cleaning in the lower portion 122.

The cleaning RF power source 123 may provide power from about 250 W to about 1000 W. In one example, the cleaning matching network 124 provides a frequency of 13.56 MHz. The electrode cleaning ring 126 is disposed along the chamber body 192 in the process volume 160. In some embodiments, the electrode cleaning ring 126 is disposed along a chamber liner 402 (see FIG. 4). The electrode cleaning ring 126 is a conductively coupled plasma source in communication with the cleaning RF power source 123. The electrode cleaning ring 126 surrounds the entire perimeter of the chamber body 192. The electrode cleaning ring 126 is a conductive material. For example, the electrode cleaning ring 126 is an aluminum material. The electrode cleaning ring 126 has a ring thickness 128. The ring thickness 128 is between about 0.075 inches and about 0.1875 inches. The electrode cleaning ring 126 has a ring height 127. The ring height 127 is between about 0.5 inches and about 3.0 inches.

The electrode cleaning ring 126 is disposed below the substrate support 115 or in plane with an upper surface 117 of the substrate support 115. The electrode cleaning ring 126 is disposed in the lower portion 112 of the process volume 160. For example, the electrode cleaning ring 126 has a ring position 119. The ring position 119 is defined as the distance from the upper surface 117 of the substrate support 115 to the electrode cleaning ring 126. The ring position 119 is between about 0.0 inches and about 5.0 inches. For example, the ring position 119 is between about 2 inches and about 3 inches.

The CCP cleaning system 122 facilitates generation of a cleaning plasma directly in the lower portion 112. As such, the CCP cleaning system 122 removes the deposition residue from the lower portion 112. The RF power feed-through 121 couples the incoming RF power to the electrode cleaning ring 126, which facilitates generation of a capacitively-coupled plasma relative to the showerhead 135 (or other RF return in the lid 105). The CCP cleaning system 122 propagates RF plasma in the lower portion 112 to remove the deposition residue.

During the cleaning process, the first RF power source 165 provides about 3 KW to about 7 KW of RF power to the lid assembly 105 at about 2 MHz. During the deposition process, the second RF power source 170 provides about 500 W to about 1000 W of RF power to the second RF electrode 260 (see FIG. 2). The second RF power source 170 is the primary processing RF power source (e.g., source used during deposition). The second RF power source 170 can also be overlayed with 2 MHz frequency. A switch is configured to divert the 2 MHZ feed between the second RF power source 170 and to the first RF power source 165 during the cleaning process. The first RF power source 165 may be used only for the cleaning process. In some embodiments, the second RF power source 170 is turned on to also help with cleaning efficiency on the cathode. The second RF power source 170 may be provided at 13.56 MHz.

The first RF power source 165 facilitates maintenance or generation of plasma generated from a cleaning gas. The cleaning gas is provided through the central conduit 191. In one example, the remote plasma source 150 is omitted, and the cleaning gas is ionized into a plasma in situ via the first RF power source 165. While embodiment are described using multiple RF power sources, it is contemplated that the first RF power source 165, the second RF power source 170, and the cleaning RF power source 123 all are provided via a single RF source with switchable frequencies. Stated otherwise, the application contemplates a reduced number of power sources.

The first RF power source 165 facilitates maintenance or generation of plasma generated from a cleaning gas. The cleaning gas is provided through the central conduit 191. In one example, the remote plasma source 150 is omitted, and the cleaning gas is ionized into a plasma in situ via the first RF power source 165. It is contemplated that the first RF power source 165, the second RF power source 170, and the cleaning RF power source 123 all are provided via (or combined into) a single RF source with switchable frequencies.

In some cleaning processes, the first RF power source 165 provides a power between about 6 KW and about 7 KW at a frequency of about 2 MHz. The cleaning RF power source 123 provides a power of between about 500 W and about 1000 W at a frequency of about 13.56 MHz. In one embodiment, which can be combined with other embodiments described herein, the first RF power source 165 and the cleaning RF power source 123 provide power simultaneously.

FIG. 2 depicts a schematic cross-sectional view of the substrate support 115 used in the processing systems of FIG. 1. The substrate support 115 includes a heater element 270 suitable for controlling the temperature of a substrate 145 supported on an upper surface 117 of the substrate support 115. The heater element 270 is embedded in the substrate support 115. The substrate support 115 is resistively heated by applying an electric current from a heater power source 221 to the heater element 270. The heater power source 221 is coupled through an RF filter 216. The RF filter 216 is used to protect the heater power source 221 from RF energy. The heater element 270 is made of a nickel-chromium wire encapsulated in a nickel-iron-chromium alloy (e.g., INCOLOY® alloy) sheath tube. The electric current supplied from the heater power source 221 is regulated by the controller 194 to control the heat generated by the heater element 270, thus maintaining the substrate 145 and the substrate support 115 at a substantially constant temperature during film deposition. The supplied electric current is adjusted to selectively control the temperature of the substrate support 115 to be about −50° C. to about 600° C.

The substrate support 115 includes a chucking electrode 210, which is a mesh of a conductive material. The chucking electrode 210 is embedded in the substrate support 115. The chucking electrode 210 is coupled to a chucking power source 212 that, when energized, electrostatically clamps the substrate 145 to the upper surface 117 of the substrate support 115. The chucking electrode 210 is coupled through an RF filter 214 to the chucking power source 212, which provides direct current (DC) power to electrostatically secure the substrate 145 to the upper surface 117 of the substrate support 115.

A power application system 220 is coupled to the substrate support 115. The power application system 220 includes the heater power source 221, the chucking power source 212, a first radio frequency (RF) power source 230, and a second RF power source 240. The first RF power source 230 and second RF power source 240 make up the second RF power source 170. The power application system 220 includes the controller 194, and a sensor device 250 that is in communication with the controller 194 and both of the first RF power source 230 and the second RF power source 240. In some embodiments, the controller 194 is used to control the plasma from the processing gas by application of RF power from the first RF power source 230 and the second RF power source 240 in order to deposit a layer of material on the substrate 145.

The substrate support 115 also includes a second RF electrode 260, and together with the chucking electrode 210, applies RF power to tune the plasma. The first RF power source 230 is coupled to the second RF electrode 260 while the second RF power source 240 is coupled to the chucking electrode 210. A first matching network and a second matching network is provided for the first RF power source 230 and the second RF power source 240, respectively.

The first RF power source 230 and the second RF power source 240 produce power at the same frequency or a different frequency. In one or more embodiments, one or both of the first RF power source 230 and the second RF power source 240 independently produces power at a frequency from about 350 KHz to about 100 MHz (e.g., 350 KHz, 2 MHz, 13.56 MHz, 27 MHz, 40 MHz, 60 MHz, or 100 MHz). In one or more embodiments, the first RF power source 230 produces power at a frequency of 13.56 MHz and the second RF power source 240 produces power at a frequency of 2 MHz, or vice versa. RF power from one or both of the first RF power source 230 and second RF power source 240 is varied in order to tune the plasma. For example, the sensor device 250 is used to monitor the RF energy from one or both of the first RF power source 230 and the second RF power source 240. Data from the sensor device 250 is communicated to the controller 194, and the controller 194 is utilized to vary power applied by the first RF power source 230 and the second RF power source 240.

In one or more embodiments, the substrate support 115 has the chucking electrode 210 and an RF electrode separate from each other, and the first RF bias can be applied to the second RF electrode 260 and the second RF bias can be applied to the chucking electrode 210. In one or more examples, the first RF bias is provided at a power of about 10 watts to about 3,000 watts at a frequency of about 350 KHz to about 100 MHz and the second RF bias is provided at a power of about 10 watts to about 3,000 watts at a frequency of about 350 KHz to about 100 MHz. In other examples, the first RF bias is provided at a power of about 2,500 watts to about 3,000 watts at a frequency of about 13.56 MHz and the second RF bias is provided at a power of about 800 watts to about 1,200 watts at a frequency of about 2 MHz. For example, the first RF bias is provided at 6 kW at 13.56 MHz or 3 kW at 40 MHz. The second RF bias is overlayed at 2 MHz for improved deposition results In one or more embodiments, a deposition gas containing one or more hydrocarbon compounds and one or more optional dopant compounds are flowed or otherwise introduced into the process volume of the process chamber, such as a PECVD chamber. The hydrocarbon compound and the dopant compound are independently flowed or introduced into the process volume. In some examples, one or more substrates are positioned on a substrate support in the process chamber. The substrate support can have a chucking electrode and an RF electrode separate from each other. A plasma is ignited or otherwise generated at or near the substrate (e.g., substrate level) by applying a first RF bias to the RF electrode and a second RF bias to the chucking electrode. The doped diamond-like carbon film is deposited or otherwise formed on the substrate. In some embodiments, a patterned photoresist layer is deposited or otherwise formed over the doped diamond-like carbon film, the doped diamond-like carbon film is etched or otherwise formed in a pattern corresponding with the patterned photoresist layer, and the pattern is etched or otherwise formed into the substrate. Deposition residue is formed in the process volume 160 during the deposition process.

Figure 3:
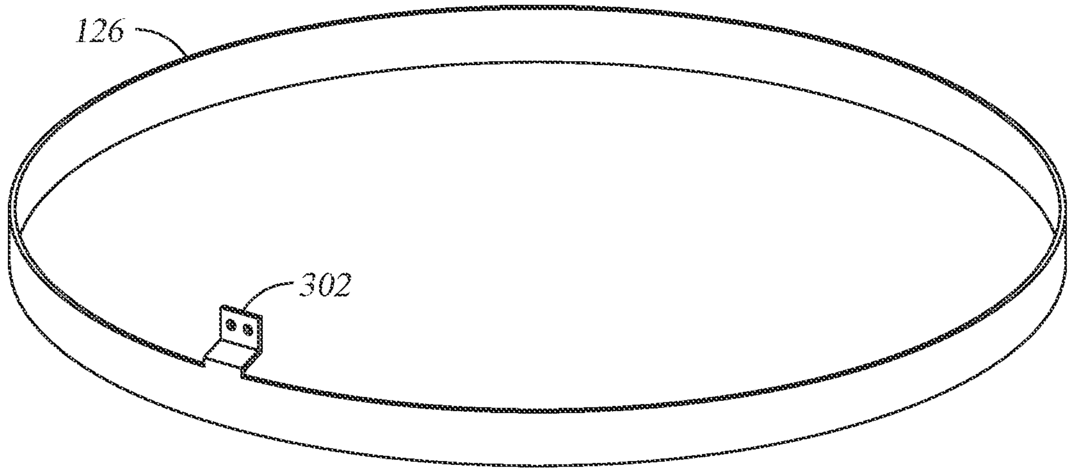
FIG. 3 depicts an isometric view of an electrode cleaning ring according to an embodiment.

FIG. 3 depicts an isometric view of an electrode cleaning ring 126. As discussed above, the electrode cleaning ring 126 is disposed along the chamber body 192 in the process volume 160. The electrode cleaning ring 126 is conductively coupled to the cleaning RF power source 123. The electrode cleaning ring 126 includes a connection piece 302. The connection piece 302 is disposed on the electrode cleaning ring 126 and extends vertically therefrom. The connection piece 302 is a conductive material. For example, the connection piece 302 is an aluminum material. The connection piece includes a right-angled bend and has one or more openings formed therethrough to facilitate an electrical connection thereto. However, other shapes and other fastening mechanisms are also contemplated.

Figure 4:
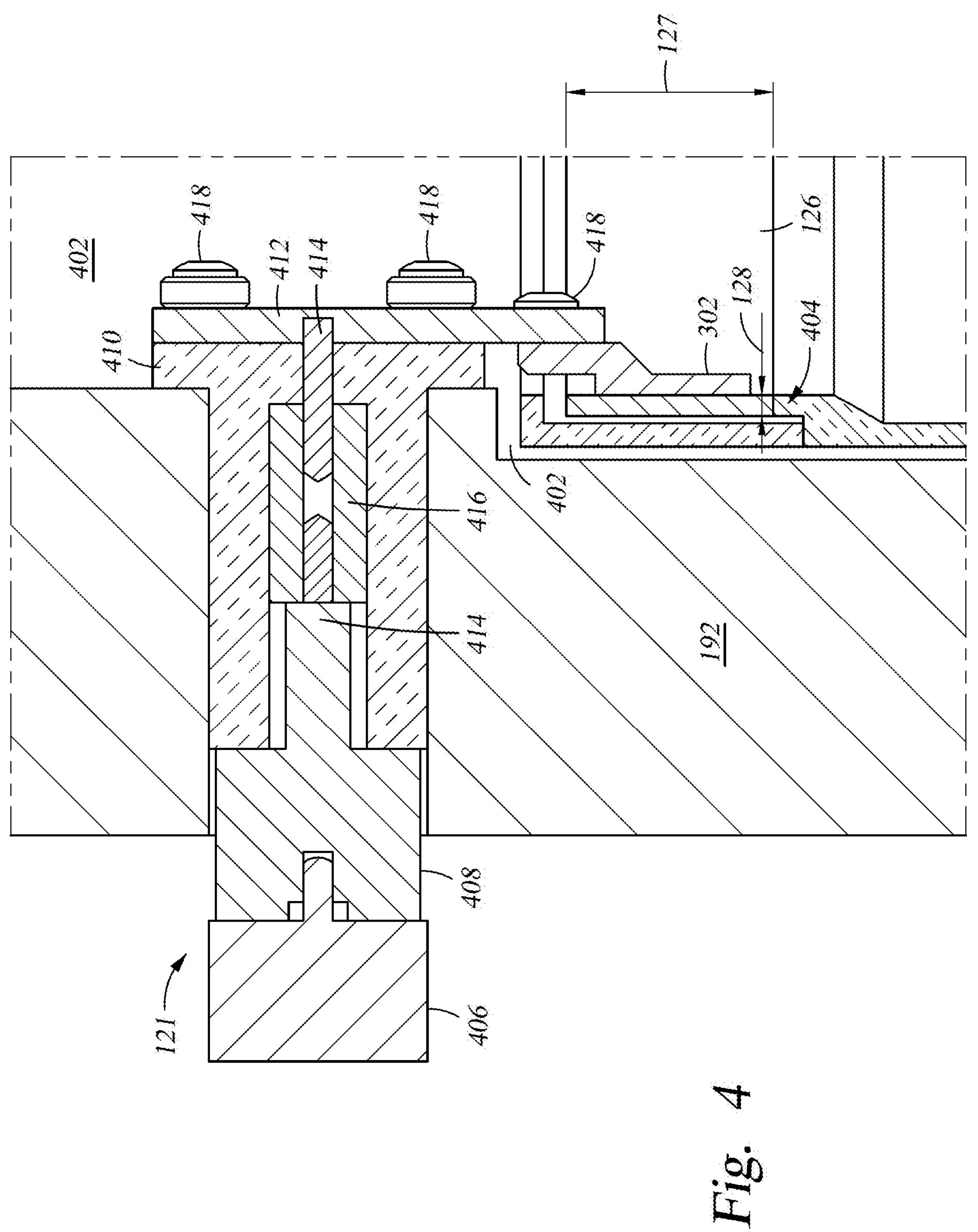
FIG. 4 is an enlarged schematic sectional view of the processing chamber according to an embodiment.

FIG. 4 is an enlarged schematic sectional view of the processing chamber 100 shown in FIG. 1. An RF power feed-through 121 is shown. The RF power feed-through is operable to provide RF power from the cleaning RF power source 123 to the electrode cleaning ring 126. The RF power feed through 121 is disposed through the chamber body 192. In some embodiments, which can be combined with other embodiments described herein, a chamber liner 402 is disposed along the chamber body 192. The chamber liner 402 may also be disposed in the lower portion 112 of the process volume 160. The chamber liner 402 is grounded. The chamber body 192 is grounded. The path for RF energy to propagate from the chamber liner 402 and the chamber body 192 to the ground improves current flow. Ring insulators 404 are disposed between the electrode cleaning ring 126 and the chamber body 192 and/or the chamber liner 402. The ring insulators 404 may be made of a dielectric material such as quartz, silicon, or a ceramic material. The ring insulators 404 can be coupled to the chamber body 192. The ring insulators 404 isolate the chamber liner 402 from the electrode cleaning ring 126, which is RF hot. In some embodiments, the electrode cleaning ring 126 sits on the ring insulators 404.

The RF power feed-through 121 allows for the RF power to be delivered to the electrode cleaning ring 126. The RF power feed-through 121 includes a first RF connector 406, a second RF connector 408, an insulation pad 410, a mounting plate 412, solder joints 414, and a conductive element 416. In some embodiments, the RF power feed-through 121 is fixed in the chamber body 192 with a metal plate that is mounted to the chamber body 192 and the RF power feed-through 121. The first RF connector 406 is coupled to the second RF connector 408. The first RF connector 406 is in communication with the cleaning matching network 124 and the cleaning RF power source 123. The second RF connector 408 distributes the RF power to the conductive element 416. The conductive element 416 is a conductive material such as copper. For example, the conductive element is an aluminum oxide material. The conductive element 416 may be a cylindrical shape. One or both of the first RF connector 406 and the second RF connector 408 may include an electrically insulating material surrounding an electrically conductive core to facilitate power transmission. One of the solder joints 414 is coupled to the conductive element 416 and the second RF connector 408. Another of the solder joints 414 is coupled to the conductive element 416 and the mounting plate 412. The insulation pad 410 is disposed between the conductive element 416 and the solder joints 414. The insulation pad 410 may be made of a dielectric material such as quartz, silicon, or a ceramic material. The insulation pad 410 is also disposed between the chamber liner 402 and the mounting plate 412. The insulation pad 410 isolates the chamber liner 402 and the chamber body 192, which are grounded, from the conductive element 416, the solder joints 414, and the mounting plate 412. The conductive element 416, the solder joints 414, and the mounting plate 412 are RF hot.

RF power is provided to the mounting plate 412. The mounting plate 412 is coupled to the chamber liner 402. The mounting plate 412 is a conductive material. For example, the mounting plate 412 is an aluminum material. The insulation pad 410 is disposed between the mounting plate 412 and chamber liner 402. Mounting screws 418 are disposed through the mounting plate 412 to couple the mounting plate 412 to the chamber liner 402. The mounting screws 418 can also couple the connection piece 302 of the electrode cleaning ring 126 to the mounting plate 412. The RF power is delivered from the mounting plate 412, to the connection piece 302, to the electrode cleaning ring 126. The mounting plate 412, the connection piece 302, and the electrode cleaning ring 126 are RF hot. In some embodiments, which can be combined with other embodiments described herein, the RF power feed through 121 is vacuum sealed to the chamber body 192.

Figure 5:
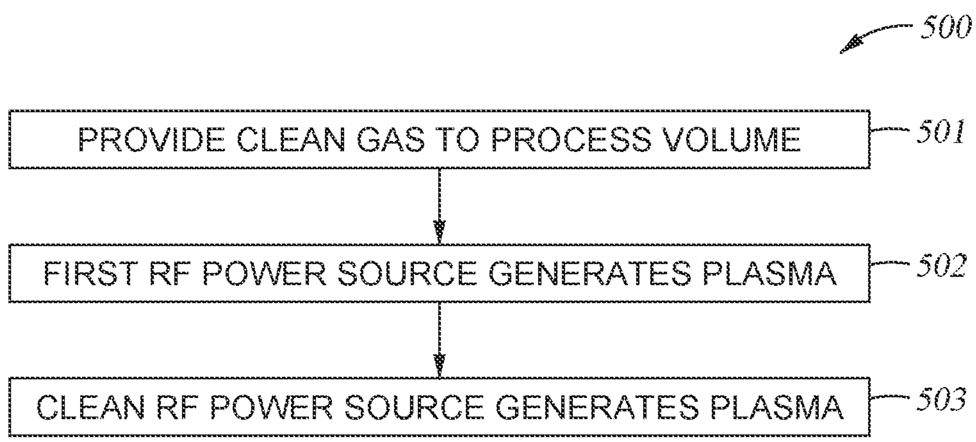
FIG. 5 is a flow diagram of a method of a cleaning process with an electrode cleaning ring according to an embodiment.

FIG. 5 is a flow diagram of a method 500 of a cleaning process with an electrode cleaning ring 126. To facilitate explanation, the method 500 will be described with reference to the processing chamber 100 of FIG. 1. However, the method 500 is not limited to the processing chamber 100 of FIG. 1 and may be performed in other substrate processing chambers that include the electrode cleaning ring 126. The method 500 include the cleaning process that allows for plasma generation being propagated into a lower portion 112 of a process volume 160. The method 500 allows for cleaning of areas where deposition residue forms in the lower portion 112.

At operation 501, a cleaning gas is provided through a central conduit 191 formed axially through a lid assembly 105 to the process volume 160.

At operation 502, a first RF power source 165 facilitates generation of a plasma. Alternatively, the cleaning gas is ionized by a remote plasma source 150. In one example, the first RF power source 165 provides a frequency of 2 MHz. The ionized cleaning gas is propagated into the process volume 160 to remove deposition residue in an upper portion of the chamber.

At operation 503, a cleaning RF power source 123 facilitates generation of a plasma. The cleaning RF power source 123 provides RF power to the electrode cleaning ring 126. The electrode cleaning ring 126 ionizes the cleaning gas into the plasma. In one example, the cleaning RF power source 123 provides a frequency of about 13 MHz. The plasma from the electrode cleaning ring 126 propagates to a lower portion 112 of the process volume 160 to remove deposition residue. In one embodiment, which can be combined with other embodiments described herein, the cleaning RF power source 123 and the first RF power source 165 are activated and providing power simultaneously.

In summation, a substrate processing chamber, and methods for cleaning the substrate processing chamber are provided herein. An electrode cleaning ring is disposed in a lower portion of a process volume (e.g., disposed below a substrate support in the process volume). The electrode cleaning ring is a capacitively coupled plasma source. The electrode cleaning ring propagates plasma into the lower portion of the process volume. RF power is provided to the electrode cleaning ring via an RF power feed-through. The RF plasma propagated by the electrode cleaning ring removes deposition residue in the lower portion of the process volume. The lower portion is generally difficult to clean, and therefore the electrode cleaning ring improves the chamber cleaning process.

While the foregoing is directed to embodiments of the present disclosure, other and further embodiments of the disclosure can be devised without departing from the basic scope thereof, and the scope thereof is determined by the claims that follow.

What is claimed is:

1. A process chamber, comprising:

a lid assembly;

a chamber body coupled to the lid assembly by a spacer, the spacer and the chamber body defining a process volume, the spacer having a height of about 0.5 inches to about 20 inches;

a seal disposed at the interface of the spacer and the chamber body;

a substrate transfer port disposed through the spacer;

a substrate support disposed and movable within the process volume; and an electrode cleaning ring disposed below the substrate transfer port, and around a perimeter of and within a lower portion of the process volume, wherein the electrode cleaning ring is positioned below at least an upper surface of the substrate support.

2. The process chamber of claim 1, wherein the electrode cleaning ring is in communication with a cleaning RF power source.

3. The process chamber of claim 1, wherein the electrode cleaning ring is an aluminum material.

4. The process chamber of claim 1, wherein the electrode cleaning ring has a ring thickness between about 0.075 inches and about 0.1875 inches.

5. The process chamber of claim 1, wherein electrode cleaning ring has a ring height between about 0.5 inches and about 3.0 inches.

6. The process chamber of claim 1, wherein the electrode cleaning ring has a ring position defined as a vertical distance from the upper surface of the substrate support to the electrode cleaning ring, wherein the ring position is less than about 5 inches.

7. The process chamber of claim 1, wherein the substrate support is coupled to a facilities cable and comprises an electrostatic chuck having a puck including a plurality of electrodes.

8. A process chamber, comprising:

a lid assembly;

a chamber body coupled to the lid assembly by a spacer, the spacer and the chamber body defining a process volume, the spacer having a height of about 0.5 inches to about 20 inches;

a seal disposed at the interface of the spacer and the chamber body;

a substrate transfer port disposed through the spacer;

a substrate support disposed and movable within the process volume;

an electrode cleaning ring disposed below the substrate transfer port, and around a perimeter of and within a lower portion of the process volume, wherein the electrode cleaning ring is positioned below at least an upper surface of the substrate support;

a radiofrequency (RF) power feed-through disposed through the chamber body and a chamber liner coupled to the chamber body in the process volume, wherein the RF power feed-through is coupled to the electrode cleaning ring; and a cleaning RF power source conductively coupled to the electrode cleaning ring via the RF power feed-through.

9. The process chamber of claim 8, wherein the RF power feed-through comprises:

a conductive element;

a first RF connector; and a second RF connector coupled to the first RF connector, wherein the second RF connector is coupled to the conductive element via a first solder joint.

10. The process chamber of claim 9, wherein the RF power feed-through further comprises a mounting plate coupled to the conductive element via a second solder joint, wherein the mounting plate is a conductive material.

11. The process chamber of claim 10, wherein the mounting plate is coupled to the electrode cleaning ring via a connection piece, wherein the cleaning RF power source provides RF power to the electrode cleaning ring through the RF power feed-through.

12. The process chamber of claim 10, wherein the RF power feed-through further comprises an insulation pad disposed around the conductive element and in between the chamber liner and the mounting plate.

13. The process chamber of claim 8, wherein the electrode cleaning ring has a ring position defined as a vertical distance from the upper surface of the substrate support to the electrode cleaning ring, wherein the ring position is less than 5 inches.

14. The process chamber of claim 8, wherein the electrode cleaning ring is an aluminum material.

15. The process chamber of claim 8, wherein the chamber body and the chamber liner are grounded.

16. The process chamber of claim 1, wherein the electrode cleaning ring is facilitates generation of a capacitively coupled plasma.

17. The process chamber of claim 1, wherein the electrode cleaning ring comprises a connection piece extending vertically from the electrode cleaning ring.

18. The process chamber of claim 1, further comprising a ring insulator disposed vertically below the electrode cleaning ring and inward of the chamber body.

19. The process chamber of claim 8, further comprising a ring insulator disposed vertically below the electrode cleaning ring and inward of the chamber liner.

20. The process chamber of claim 1, wherein the substrate support is vertically movable within the process volume.

* * * * *